United States Patent
Lee et al.

(10) Patent No.: US 7,808,827 B2
(45) Date of Patent: Oct. 5, 2010

(54) CONTROLLED BIT LINE DISCHARGE FOR CHANNEL ERASES IN NONVOLATILE MEMORY

(75) Inventors: Aaron Lee, Mountain View, CA (US); Nian Yang, Mountain View, CA (US); Jiani Zhang, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 286 days.

(21) Appl. No.: 11/935,717

(22) Filed: Nov. 6, 2007

(65) Prior Publication Data

US 2009/0119447 A1 May 7, 2009

(51) Int. Cl.
*G11C 11/34* (2006.01)

(52) U.S. Cl. .......................... 365/185.18; 365/185.22; 365/185.24; 365/185.25; 365/185.29

(58) Field of Classification Search ............ 365/185.29, 365/185.18, 189.29, 185.23, 185.33, 185.22, 365/185.24, 185.25
See application file for complete search history.

(56) References Cited

U.S. PATENT DOCUMENTS

| | | | | |
|---|---|---|---|---|
| 3,765,002 A | * | 10/1973 | Basse | ......................... 365/149 |
| 6,667,910 B2 | * | 12/2003 | Abedifard et al. | ...... 365/185.29 |
| 7,160,773 B2 | | 1/2007 | Randolph | |
| 2006/0104122 A1 | * | 5/2006 | Choy | ..................... 365/185.29 |

* cited by examiner

*Primary Examiner*—Pho M Luu
*Assistant Examiner*—Tha-O Bui
(74) *Attorney, Agent, or Firm*—Turocy & Watson, LLP

(57) ABSTRACT

Systems and/or methods that facilitate discharging bit lines (BL) associated with memory arrays in nonvolatile memory at a controlled rate are presented. A discharge component facilitates discharging the BL at a desired rate thus preventing the "hot switching" phenomenon from occurring within a y-decoder component(s) associated with the nonvolatile memory. The discharge component can be comprised of, in part, a discharge transistor component that controls the rate of BL discharge wherein the gate voltage of the discharge transistor component can be controlled by a discharge controller component. The rate of BL discharge can be determined by the size of discharge transistor component used in the design, the strength and/or size of the y-decoder component, the number of erase errors that occur for a particular memory device, and/or other factors in order to facilitate preventing hot switching from occurring.

20 Claims, 12 Drawing Sheets

CONTROLLED BIT LINE DISCHARGE FOR CHANNEL ERASES IN NONVOLATILE MEMORY

TECHNICAL FIELD

The subject innovation relates generally to erasing data in memory systems and in particular, to systems and/or methodologies that can facilitate a channel erase in nonvolatile memory.

BACKGROUND

A wide variety of memory devices can be used to maintain and store data and instructions for various computers and similar systems. In particular, nonvolatile memory such as, for example, flash memory is a type of electronic memory media that can maintain and store data content without consumption of power. Flash memory has become popular, at least in part, because it combines the advantages of the high density and low cost of erasable programmable read only memory (EPROM) with the electrical erasability of electronically erasable programmable read only memory (EEPROM). It is used in many portable electronic products, such as cell phones, smart cards, security cards, portable computers, voice recorders, thumbnail drives etc. The fact that flash memory can be rewritten as well as its retention of data without a power source, small size and light weight have all combined to make flash memory devices useful and popular means for transporting and maintaining data.

As flash memory devices have continued to evolve, the density of data stored in such devices has increased. Some technologies have been introduced and have evolved to improve the density of these flash devices such as, for example, Multi-Level Cell (MLC) based flash devices and MirrorBit based flash devices. Further, as memory devices increase in density, ensuring that data is effectively erased from a memory device to maintain data integrity, for example, during subsequent programming of the memory device is desirable.

Traditionally, flash memory devices have used band-to-band hot-hole (HH) injection to lower the $V_t$ of the core cells during erase operations. During a HH injection erase operation a charge of approximately 6 volts is applied to bit lines (BLs) of a memory array. At the end of the HH injection erase, the BLs are typically discharged by the y-decoding circuitry of the memory array. The y-decoding circuits can reliably function when approximately 6 volts is discharged from the BLs. Another type of erase technique can be the Fowler-Nordheim Tunneling technique, which can also be known as a channel erase. During a channel erase, there can be a higher voltage level (e.g., approximately 10 volts) associated with the BLs, and such voltage is to be discharged after the erase is performed. Conventionally, there can be reliability and functionality issues, such as hot switching issues, within the y-decoding circuitry when a BL discharge is performed when the higher voltages associated with a channel erase are used.

It is desirable to discharge the higher BL voltages associated with a channel erase at a controlled rate to facilitate reliable operation of memory devices. Further, by controlling the discharge rate of associated BLs during a channel erase operation can help prevent disturbing the core cells of memory devices. A controlled BL voltage discharge rate can also avoid reliability and functionality issues for conventional discharge mechanisms associated with the y-decoder component during the discharge phase of channel erase operations.

SUMMARY

The following presents a simplified summary of the innovation in order to provide a basic understanding of some aspects described herein. This summary is not an extensive overview of the disclosed subject matter. It is intended to neither identify key or critical elements of the disclosed subject matter nor delineate the scope of the subject innovation. Its sole purpose is to present some concepts of the disclosed subject matter in a simplified form as a prelude to the more detailed description that is presented later.

Memory devices (e.g., flash memory) can be comprised, in part, of an array of core cells, bit lines, word lines, an x-decoder component(s), and a y-decoder component, where data can be written to core cells, stored data can be read from core cells, and/or data can be erased from the core cells. Conventionally, a technique known as band-to-band hot-hole (HH) injection (hereinafter referred to as a "HH injection erase") can be employed to facilitate erasing the core cells in memory devices. During a HH injection erase process, a y-decoder component that can comprise y-decoder circuitry can be used to facilitate a charge on the bit lines to erase the desired core cells. The y-decoder component can also be used to facilitate discharging the bit lines during a HH injection erase process.

Another technique that can be used for erasing core cells associated with memory devices is known as the Fowler-Nordheim Tunneling technique (hereinafter referred to as a "channel erase"). A channel erase can provide a more effective erase of core cells and can provide better erase performance than that of a HH injection erase. One of the differences between a HH injection erase and a channel erase can be that a higher voltage can be induced on the bit lines during a channel erase than during a HH injection erase. The higher voltage applied to the bit lines associated with a channel erase can cause, for example, reliability and functionality issues such as hot switching within the y-decoding component during a channel erase operation.

In accordance with one aspect of the disclosed subject matter, a discharge component can be employed to facilitate discharging of bit lines during a channel erase to facilitate reducing and/or eliminating the functionality and/or reliability issues associated with the y-decoder component(s) (e.g., y-decoder circuitry) of a memory during channel erase operations. In accordance with one aspect, the discharge component can be comprised of, in part, a discharge transistor component wherein the discharge transistor component can be connected to the bit lines of the memory. The discharge transistor component can facilitate discharging the bit lines during channel erase operations. In one aspect, the voltage of the gate of the discharge transistor component can be controlled by a discharge controller component to facilitate the discharge rate of the associated bit lines of a memory during channel erase operations.

In accordance with one aspect of the disclosed subject matter, the rate of discharge for bit lines during channel erase operations can be determined, in part, by the size of the discharge transistor component used in the discharge component. In another aspect, the rate of discharge can be determined by the strength and/or size of the y-decoder component. In yet another aspect, the rate of discharge can be determined by the voltage a discharge controller component supplies to the gate of the discharge transistor component.

By using this new discharge system, the discharge rate of BLs can be achieved during a channel erase, thus reducing or eliminating the hot switching phenomenon from occurring during the channel erase operation. The discharge system can also allow the use of existing y-decoder component(s) associated with nonvolatile memory devices wherein a channel erase is used to erase the memory arrays of the memory devices.

The following description and the annexed drawings set forth in detail certain illustrative aspects of the disclosed subject matter. These aspects are indicative, however, of but a few of the various ways in which the principles of the innovation may be employed and the disclosed subject matter is intended to include all such aspects and their equivalents. Other advantages and distinctive features of the disclosed subject matter will become apparent from the following detailed description of the innovation when considered in conjunction with the drawings.

DETAILED DESCRIPTION

Figure 1:
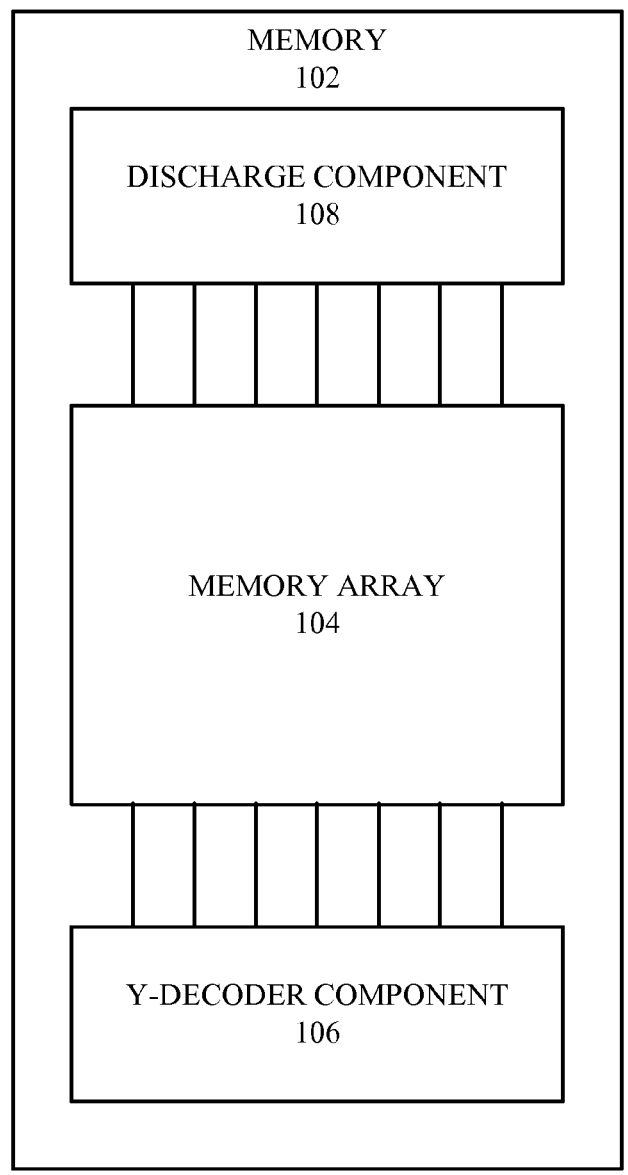
FIG. 1 illustrates a block diagram of a system that facilitates discharging bit lines in a memory array in accordance with an aspect of the subject matter disclosed herein.

The disclosed subject matter is described with reference to the drawings, wherein like reference numerals are used to refer to like elements throughout. In the following description, for purposes of explanation, numerous specific details are set forth in order to provide a thorough understanding of the subject innovation. It may be evident, however, that the disclosed subject matter may be practiced without these specific details. In other instances, well-known structures and devices are shown in block diagram form in order to facilitate describing the subject innovation.

Conventionally, a hot-hole (HH) injection technique can be used to facilitate erasing core cells in nonvolatile memory devices during memory erase operations. The HH injection technique can be used to facilitate lowering the $V_t$ voltage (threshold voltage (e.g., the voltage applied to the gate of a transistor to "turn-on" the transistor)) of core cell transistors within nonvolatile memory devices to an erase state. As an alternative to using HH injection to facilitate erase operations, a Fowler-Nordheim Tunneling technique (hereinafter also referred to as a "channel erase") can be used to erase the core cells. The channel erase can be performed on nonvolatile memory devices, in part, by inducing a higher voltage (e.g. approximately 10 volts) to the associated bit lines (BLs) of the core cell transistors than that used when performing an HH injection erase operation. The channel erase can provide better erase performance than that of the HH injection erase in memory devices. However, the higher BL voltage associated with a channel erase can cause a phenomenon known as hot-switching within the y-decoder component of a nonvolatile memory device during the BL discharge phase of an erase operation. The hot-switching phenomenon can be reduced or eliminated by either redesigning the y-decoder component or by controlling the discharge rate of the BLs during an erase operation. For example, the y-decoder component can be redesigned to add protection devices to prevent the hot-switching; however, it can be more cost efficient to add a circuit that can facilitate discharging the BLs to reduce or eliminate reliability issues in the memory device, as opposed to redesigning the conventional y-decoder component to accommodate the higher voltages associated with channel erases.

Systems and methods that can facilitate controlling the discharge rate of BLs associated with erase operations in nonvolatile memory devices are presented. A discharge component can be employed to facilitate reducing or eliminating memory function issues, such as hot switching in a y-decoder component, when a channel erase is performed in nonvolatile memory devices (e.g., flash memory). The discharge component can facilitate controlling the discharge rate of the BLs associated with a memory array(s), which can reduce or eliminate hot-switching. Further, the discharge component can be utilized in conjunction with conventional y-decoder components associated with memory devices.

Turning to FIG. 1, illustrated is a system 100 that facilitates erasing memory cells in accordance with an aspect of the disclosed subject matter. The system 100 can include memory 102 that can be comprised, in part, of a memory array 104 that can include a plurality of memory cells (not shown) that each can be comprised of a drain, gate, and source. Each memory cell can have one or more levels therein and can thereby store one or more bits of data therein, where each level can be associated with a bit of data.

It is to be appreciated that system 100 can be incorporated into a variety of nonvolatile memory to include, but not limited to flash memory (e.g. single-bit flash memory, multi-bit flash memory), mask-programmed read only memory (ROM), programmable ROM (PROM), Erasable PROM (EPROM), Ultra Violet (UV)-erase EPROM, one-time programmable ROM, electrically erasable PROM (EEPROM) and/or Ferroelectric RAM (FeRAM). Further, the nonvolatile memory can be based on a variety of nonvolatile memory technologies such as MirrorBit cell, multi-level cell (MLC), or other now-existing or future technology(ies), for example.

System 100 can also include a y-decoder component 106 (e.g., bit line (BL) decoder) that can decode inputs and/or outputs during various operations (e.g. programming, reading, verifying, erasing) that can be performed on the memory cells located within the memory array 104. The y-decoder component 106 can receive address bus information from, for example, a host processor (not shown) and/or system controller (not shown) or the like, and can utilize such information to facilitate accessing or selecting the desired memory cell(s) located within the memory array 104 (e.g. memory location (s)) associated with the command. A common bit line (BL) can be attached to a source or drain of one or more associated transistors (not shown) located within the memory array 104, the y-decoder component 106, a discharge component 108, another component associated with nonvolatile memory not illustrated herein, or a combination thereof. In accordance with an aspect of the disclosed subject matter, respective predetermined voltages, determined based in part on a respective operation, can be applied to one or more of the BLs to facilitate performing operations, such as program, read, erase, and the like.

Conventionally, during a HH injection erase operation, a charge of less than 7 volts can be applied to BLs of a memory array 104, e.g., a voltage at which current y-decoder component(s) 106 can discharge without trigging the hot-switching phenomena. During a channel erase operation, a charge of approximately 10 volts can be applied to the BLs. The channel erase can provide better erase performance than that of the HH injection erase; however, the higher voltage that can be induced on the BLs during a channel erase can cause reliability and functionality issues within y-decoder component(s) 106 and result in disturbing the core cells of a memory during the discharge process.

Memory 102 can comprise a discharge component 108 that can be associated with the memory array 104 and y-decoder component 106 to facilitate reducing and/or eliminating reliability and functionality issues within the y-decoder component 106 and the core cells of the memory array 104. In accordance with an aspect, the discharge component 108 can facilitate a channel erase of core cells in the memory 102. In one aspect, the discharge component 108 can facilitate controlling the rate of discharge of BLs during a channel erase. The discharge component 108 also can facilitate reducing the voltage drop across an associated transistor component used to discharge the BLs, thus facilitating the reduction and/or elimination of reliability issues associated with the higher BL voltages used during a channel erase. The components used within the discharge component 108 and how the discharge component 108 controls the rate of discharge of the BLs associated with a channel erase is further described infra with regard to system 200, system 300, system 400, system 500, and system 600.

Figure 2:
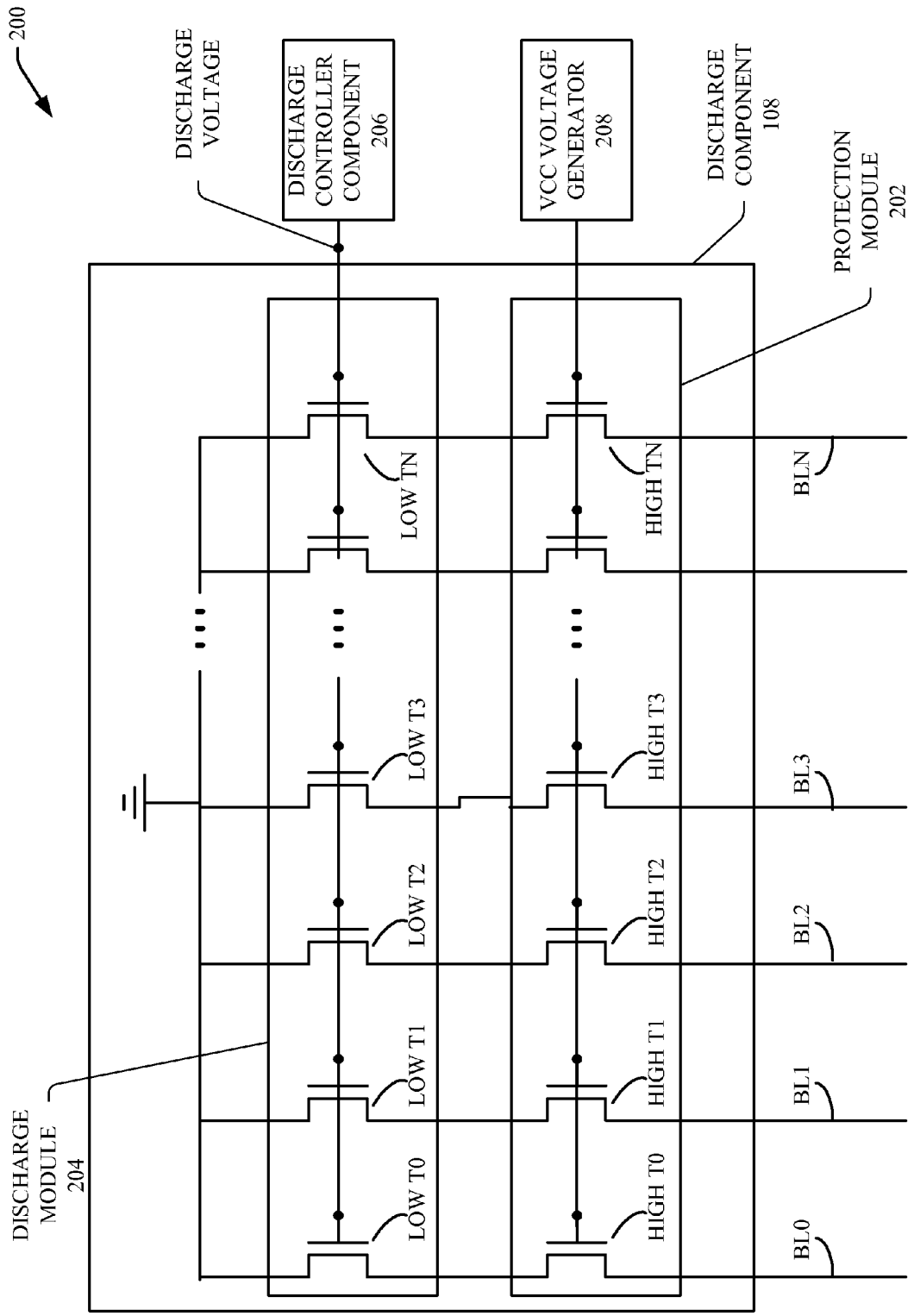
FIG. 2 depicts an example diagram of a discharge component in accordance with the disclosed subject matter.

Turning to FIG. 2, depicted is an example diagram of a system 200 that can facilitate a channel erase of a memory in accordance with one aspect of the disclosed subject matter. System 200 can include a discharge component 106 that can be used to control the discharge rate of associated BL(s) (e.g., bit lines BL0, BL1, BL2, BL3 through BLN) in memory array(s) (e.g., memory array 104) during program, read, verify, and/or erase operations in accordance with the disclosed subject matter. It is to be appreciated that the bit lines BL0, BL1, through BLN illustrated in system 200 be the same as or similar to, and can include such functionality, as more fully described herein, for example, with regard to the BL of system 100, system 500 and system 600.

The discharge component 108 can employ the use of a protection module 202 which can be comprised of transistor components HIGH T0, HIGH T1, HIGH T2, HIGH T3, through HIGH TN (hereinafter also referred to as "protection transistor components"). In accordance with one aspect of the disclosed subject matter, the protection transistor components of protection module 202 can be comprised of one or more high voltage n-type metal-oxide semiconductor (nMOS) transistors, for example. In accordance with one aspect of the disclosed subject matter, the protection module 202 and associated protection transistor components can be connected in series to the discharge module 204 wherein the discharge module 204 can be comprised of transistor components LOW T0, LOW T1, LOW T2, LOW T3, through LOW TN (hereinafter also referred to as "discharge transistor components"). In accordance with one embodiment of the disclosed subject matter, the discharge transistor components can be comprised of one or more low voltage nMOS transistors, for example. The discharge transistor components and respective protection transistor components, which can be connected in series, can electronically connect the respective BL(s) to ground.

In accordance with one aspect of the disclosed subject matter, a discharge controller component 206 can facilitate controlling a discharge voltage applied to the gate(s) of the discharge transistor components wherein the discharge voltage can directly correspond to the rate at which the BL(s) are drained of charge(s) that the BL(s) incur during a channel erase, for example. In one aspect, a $V_{CC}$ voltage generator 208 can facilitate supplying a predetermined constant voltage (e.g., $V_{CC}$) to the gate(s) of the protection transistor components to facilitate a lower voltage drop across the discharge transistor components. The protection transistor components, in turn, can facilitate electronically protecting the respective discharge transistor components from the higher voltages that can be induced on the BLs during a channel erase. For example, in accordance with an embodiment, if the BL voltage to be discharged is at 10 volts, a predetermined $V_{CC}$ voltage (e.g., 5 volts), which can be supplied by $V_{CC}$ voltage generator 208), can be applied to the gate of the discharge transistor components which in turn can facilitate a voltage drop of 5 volts–$V_t$ (e.g., approximately 4 volts) across the source and drain of the discharge transistor components. The resulting voltage drop across the source and drain of the protection transistor components can thus facilitate shielding the discharge transistor components from the 10V associated with the BLs during a channel erase. The voltage drop of approximate 4 volts across the discharge transistor components, in part, can reduce the risk or prevent the hot switching phenomenon from occurring in the discharge transistor components, thus allowing a channel erase to be performed in memory using conventional a y-decoder component(s) (e.g., 106).

Figure 3:
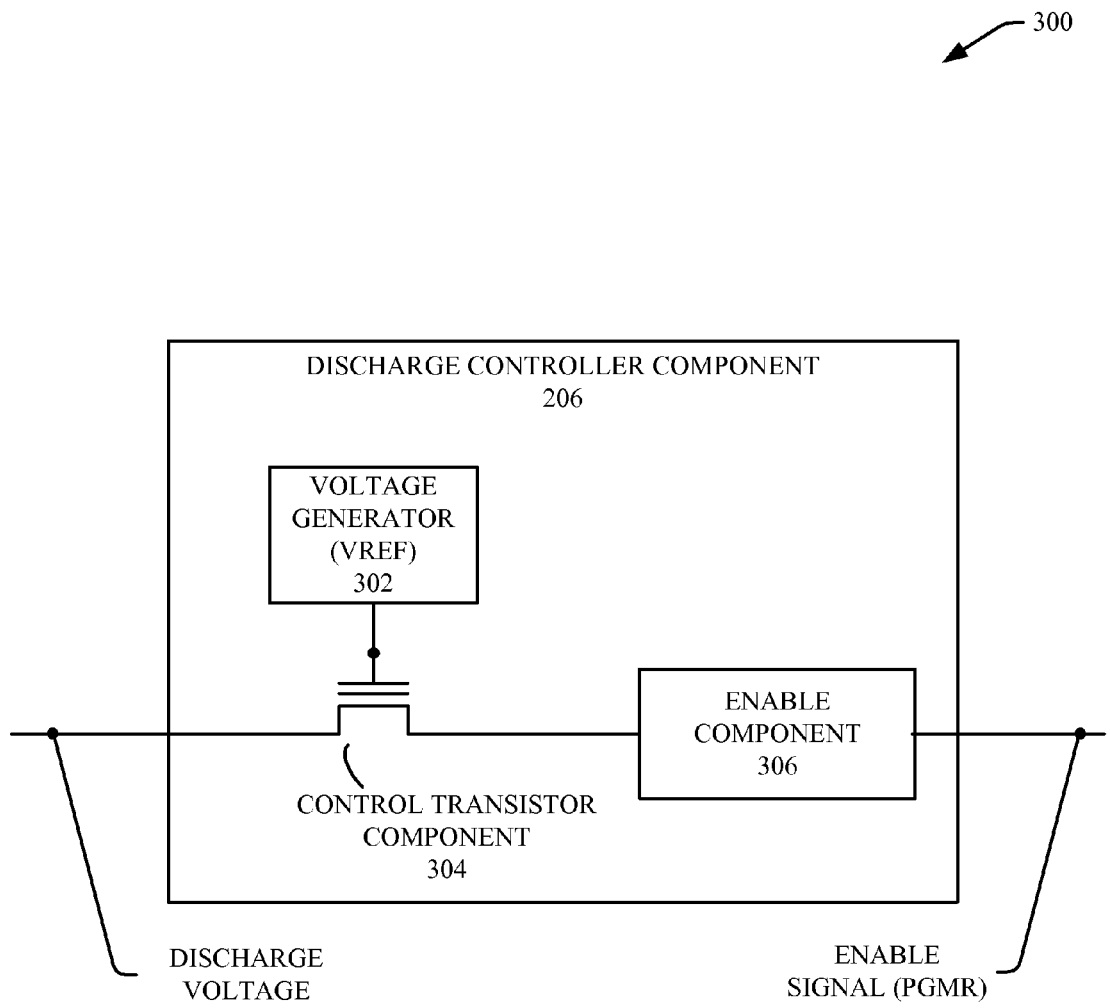
FIG. 3 depicts a block diagram of an example of a system that can control a discharge voltage supplied to the discharge component in accordance with an embodiment of the disclosed subject matter.

Referring to FIG. 3, illustrated is a block diagram of a system 300 that can facilitate supplying a discharge voltage to the discharge component 108 in accordance with the disclosed subject matter. The system 300 can include a discharge controller component 206 that can facilitate generating the gate voltage for the discharge transistor components (e.g., LOW T0, LOW T1, LOW T2, LOW T3, through LOW TN of system 200), for example. Because each BL can have its own discharge path, it is desirable that the gate voltage of the discharge transistor component be controlled to obtain the desired discharge rate. In a channel erase, the amount of time to perform a BL discharge can be controlled so that the BL discharge can be performed within a predetermined amount of time to facilitate reducing and/or eliminating undesirable functioning issues (e.g., hot-switching) in the memory 102 (e.g., as depicted in FIG. 1 and described herein). For example, the discharge controller component 206 can control the rate of BL discharge so that the BLs can be discharged within ~100 ns. This discharge rate can ensure the high voltage P-well (HVPW) (e.g., discussed infra in system 600) voltage can closely follow the BL voltage, and thereby the risk of a disturbance of the core cell during the discharge process can be reduced and/or eliminated.

In accordance with one aspect of the disclosed subject matter, during a channel erase, a voltage generator ($V_{REF}$) 302 can generate and/or supply a predetermined control voltage to a gate of the control transistor component 304 to facilitate controlling the BL discharge. In accordance with an aspect of the disclosed subject matter, the control transistor component 304 can be a low $V_t$ nMOS transistor, for example, that can facilitate "clamping" the discharge voltage supplied to the discharge transistor components. The control voltage can be generated by using a predetermined bandgap reference voltage, for example, to ensure its accuracy and consistency. As a result, the control voltage that can be supplied to the discharge transistor components can be approximately equal to the control voltage minus a $V_t$ voltage. In accordance with one embodiment, the discharge controller component 206 can facilitate supplying a discharge voltage of approximately 1.1 volts if the control voltage is equal to approximately 2.0 volts (e.g., control voltage$-V_t$), for example. In accordance with one aspect of the disclosed subject matter, a discharge voltage of approximately 1.1 volts supplied to the gate(s) of the discharge transistor components can facilitate a discharge rate of approximately 100 nanoseconds (ns), for example.

System 300 can also include an enable component 306 that can facilitate controlling when a discharge voltage is supplied to the discharge component 108 (e.g. as illustrated in FIG. 1 and described herein). In accordance with one aspect of the disclosed subject matter, the voltage generator ($V_{REF}$) 302 can facilitate supplying a constant or substantially constant control voltage to the control transistor component 304 during a channel erase, for example. At the end of the channel erase, an enable signal (PGMR) can facilitate the activation of the enable component 306 to enable the discharge voltage to be applied to the discharge transistor components (e.g., LOW T0, LOW T1, LOW T2, LOW T3, through LOW TN), for example, to facilitate discharging the BLs associated with the channel erase operation.

Figure 4:
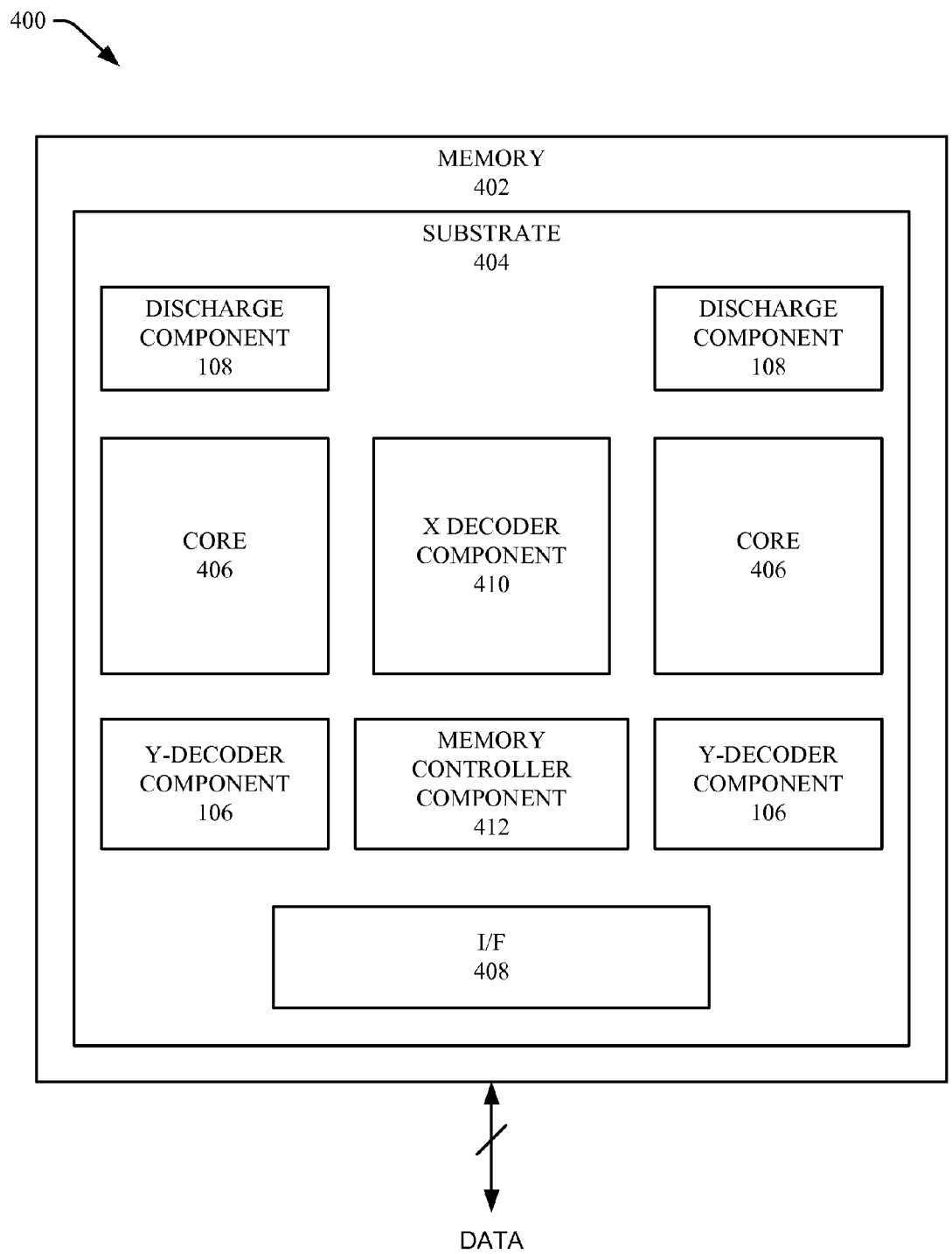
FIG. 4 depicts a block diagram of an example of a system that can store data in accordance with an embodiment of the disclosed subject matter.

Referring to FIG. 4, illustrated is a block diagram of a system 400 that can facilitate access of data associated with a memory in accordance with an aspect of the disclosed subject matter. In accordance with one aspect of the disclosed subject matter, the system 400 can be or can include a memory 402, which can be the same or substantially the same as, and/or can have the same or similar functionality as, memory 102 in reference to system 100, for example. Memory 402 can be a flash memory (e.g., single-bit flash memory, multi-bit flash memory), that can be created on a semiconductor substrate 404 in which one or more core regions 406 can be higher-density core regions, and one or more peripheral regions, which can be lower-density regions, can be formed. The high-density core regions 406 can include one or more M by N arrays (e.g., memory array(s) 104 as illustrated in FIG. 1 and described herein) of individually addressable, substantially identical multi-bit memory cells (not shown) located within one or more memory arrays (e.g., 104). The memory cells contained within memory 402 can retain stored data even while disconnected from a power source.

The lower-density peripheral regions can typically include an interface component 408 (hereinafter also referred to as "I/F 408") and programming circuitry for selectively addressing the individual memory cells. The programming circuitry can be represented in part by and can include one or more x-decoder component(s) 410 and one or more y-decoder component(s) 106 that can cooperate with the I/F 408 for selectively connecting a source, gate, and/or drain of selected addressed memory cells to predetermined voltages or impedances to effect designated operations (e.g., programming, reading, erasing) on the respective memory cells, and deriving necessary voltages to effect such operations. Further, the I/F 408 can include and/or provide various adapters, connectors, channels, communication paths, etc. to integrate the system 400 into virtually any operating and/or database system(s) and/or with another system(s). In addition, I/F 408 can provide various adapters, connectors, channels, communication paths, etc., that can provide for interaction and/or communication with other components, data, and the like, associated with the system 400.

System 400 can also include a memory controller component 412 that can facilitate control of the flow of data to and from the memory 402. In one aspect, the memory controller component 412, by itself or in conjunction with a host processor (not shown), can facilitate execution of operations (e.g., read, write, erase) associated with memory locations in the core(s) 406. In another aspect, the memory controller component 412 can facilitate verifying and/or maintaining the desired charge level(s) associated with programming or erasing data, for example, in the memory locations contained within the core(s) 406.

System 400 can also include one or more discharge component(s) 108 that can be used to facilitate discharging the BLs associated with operations such as, for example, read, program, erase and/or write operations to the memory cells located within the core(s) 406 in accordance with the disclosed subject matter. In accordance with one aspect of the disclosed subject matter, the memory controller component 412 by itself or in conjunction with a host processor, for example, can facilitate setting a positive charge level to the BLs associated with programming or erasing data from the memory locations contained within the core(s) 406. At the end of an erase operation, the memory controller component 412, for example, can work in conjunction with the y-decoder component 106 and/or discharge component 108 to remove the positive voltage that was applied to the BLs associated with the memory cells being erased. The memory controller component 412 or other control device can, for example, facilitate providing control signals to the discharge component 108 to obtain a desired discharge rate of the BLs.

Figure 5:
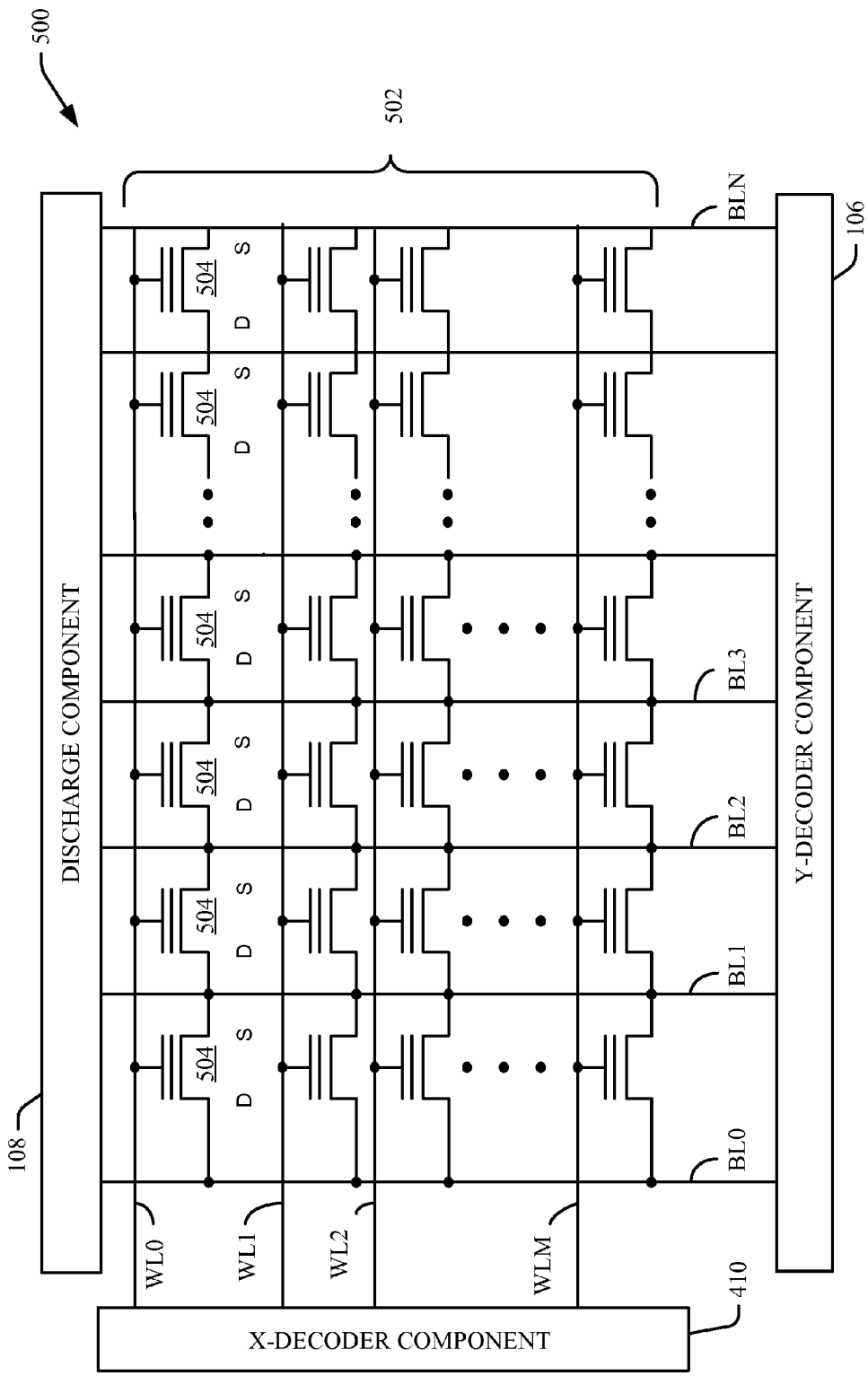
FIG. 5 is a block diagram depicting an example diagram of a system that can facilitate data storage in accordance with an aspect of the subject matter disclosed herein.

Turning to FIG. 5, depicted is an example diagram of a system 500 that can facilitate data storage accordance with an aspect of the disclosed subject matter. The system 500 can include a memory array(s) 502 that can include a plurality of memory cells 504 that each can comprise a drain/source, gate, and source/drain. In accordance with an aspect, each memory cell 504 can be a multi-level cell, where data can be represented by the level of charge stored within the cell 504, and one or more bits of data can be stored in each memory cell 504, (e.g. multi-bit memory cells, such as MirrorBit cells). The memory array 502 can be, for example, memory array 104 in system 100 and/or can be associated with the memory 402, for example, in system 400.

The system 500 can include an x-decoder component(s) 410 (e.g., word line (WL) decoder) and a y-decoder component(s) 106 (e.g., bit line (BL) decoder) as respectively described herein, for example, with regard to system 100 and/or system 400. The x-decoder components(s) 410 and y-decoder component(s) 106 can each respectively decode inputs and/or outputs during various operations (e.g., programming, reading, verifying, erasing) that can be performed on the memory cells 502. The x-decoder component 410 and y-decoder component 106 can each receive address bus information from a host processor (not shown) and/or system controller (not shown), for example, and can utilize such information to facilitate accessing or selecting the desired memory cell(s) 504 (e.g., memory location(s)) associated with the command. The memory cells 504 can be formed in M rows and N columns. A common WL can be attached to the gate of each memory cell 504 in a row, such as word-lines WL0, WL1, WL2, through WLM. As illustrated in system 500, a common BL can be attached to each cell 504 in a column, such as bit lines BL0, BL1, BL2, BL3 through BLN. A WL can contain, for example, a plurality of elements (e.g., 512, 1024, 2048, etc.) forming multiple words. A sector can include a plurality of WLs, such as, for example, 512 WLs that can provide at least 512 k elements of memory. In accordance with an aspect of the disclosed subject matter, respective voltages can be applied to one or more memory cells 504 through the WLs and BLs to facilitate performing operations, such as program, read, erase, and the like.

It is to be appreciated that while the memory cells 504 are shown as being respectively associated with a drain and a source, in accordance with one embodiment, where a memory cell 504 contains charge storage elements on two sides of the cell 504 that can each be programmed, the drain can act as the source, and/or the source can act as the drain, depending on which portion of the memory cell 504 is being charged during a given operation.

Figure 6:
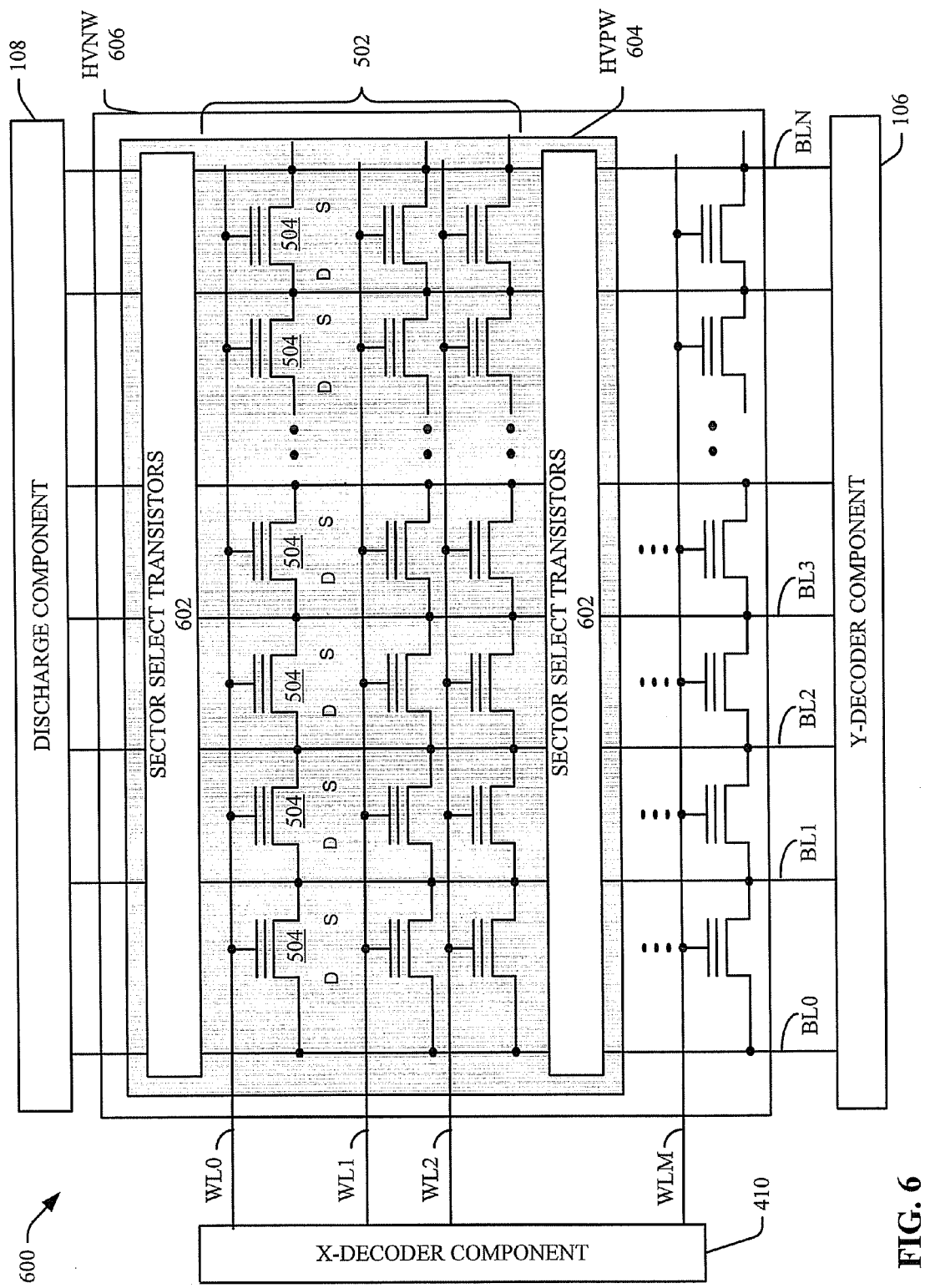
FIG. 6 illustrates an example diagram of a more detailed system that can facilitate data storage in accordance with the disclosed subject matter.

Referring to FIG. 6 illustrated is system 600 that can employ a discharge component to facilitate data storage in accordance with an aspect of the disclosed subject matter The system 600 can be the same as or similar to, and can include such functionality, as more fully described herein, for example, with regard to system 100, system 200, system 300, system 400, and/or system 500. Specifically, the x-decoder component 410 along with associated word-lines WL0, WL1, WL2, through WLM and the plurality of memory cells 504 depicted in system 600 can be the same as or similar to, and can include such functionality, as more fully described herein, for example, system 500. Further, the y-decoder component 106 and associated bit lines BL0, BL1, BL2, BL3, through BLN, the memory array(s) 502, and/or the discharge component 108 can be the same as or similar to, and can include such functionality, as more fully described herein, for example, in system 100, system 200, system 300, system 400 and/or system 500. In accordance with an aspect, memory 102 (e.g., as depicted in FIG. 1 and described herein) can comprise system 600 to facilitate the performance of operations, such as programming, reading, erasing (e.g., channel erasing), and/or verifying, on core cells (e.g., 406) in the memory 102.

System 600 can include a one or more of sector select transistor(s) 602 that can facilitate the separation of the memory array(s) 502 into a plurality of sectors or blocks that can each contain a subset of memory cells that can be selectively erased, programmed, read, and/or verified. In accordance with one aspect of the disclosed subject matter, the sector select transistor(s) 602 can facilitate a response, for example, to an address presented from the x-decoder component 410 and/or the y-decoder component 106 to activate desired sectors or blocks of the memory array(s) 502. For example, the sector select transistor(s) 602 can facilitate the selection of a block or plurality of blocks of memory locations within the memory array(s) 502 wherein an erase operation, for example, can be performed. Further, for example, the block or plurality of blocks that which the sector select transistor(s) 602 does not selected for an erase operation, for example, can remain unaltered or maintain an existing state while the erase operation is performed.

In accordance with one aspect of the disclosed subject matter, system 600 can facilitate performing channel erase operations to facilitate improved erase performance, as compared to other conventional erase techniques, such as the HH injection erase. In a channel erase, core cells (e.g., 406) can be fabricated inside of high voltage p-well HVPW(s) 604 to facilitate erasing core cells (e.g., 406) of a selected memory block. The HVPW(s) 604 can be, for example, a region doped with a p-type impurity. To further accommodate a channel erase operation, the combined core cells and/or plurality of core cells along with the associated HVPW(s) 604 regions can be fabricated within a high-voltage n-well HVNW 606 region, for example. The HVNW(s) 606 region can be, for example, a region doped with an n-type impurity. The HVPW 604 region and HVNW 606 region may be part of the substrate 404 (e.g., as depicted in FIG. 4 and described herein), for example. Further, the HVPW 410 and HVNW 606 regions can be formed by using ion implantation, for example, and the two types of regions can physically contact each other.

In accordance with one aspect of the disclosed subject matter, a channel erase can be facilitated by applying a negative voltage to all associated WL(s) (e.g., WL0, WL1, WL2, through WLM) of selected blocks (e.g., selected via the sector select transistors 602) core(s) while all the associated BL(s) (e.g., BL0, BL1, BL2, BL3 through BLN) of the selected blocks can remain floating. Further, a positive voltage can be applied to the associated HVPW(s) 604 regions of the selected blocks. After the respective negative and positive voltages have been applied to the aforementioned WL(s) HVPW(s) 604 regions, the associated BL(s) will be driven to a voltage approximately equal to a $V_t$ (e.g., approximately 0.7 volts) below the positive voltage applied to the HVPW(s) 604 regions because of the PN junction formed between the HVPW(s) 604 regions and the core cell source/drain diffusion. The discharging of the this voltage associated with the BL(s) during the channel erase operation can be controlled, for example, via the discharge component 108 as described in system 100, system 200, system 300, and/or system 400.

Figure 7:
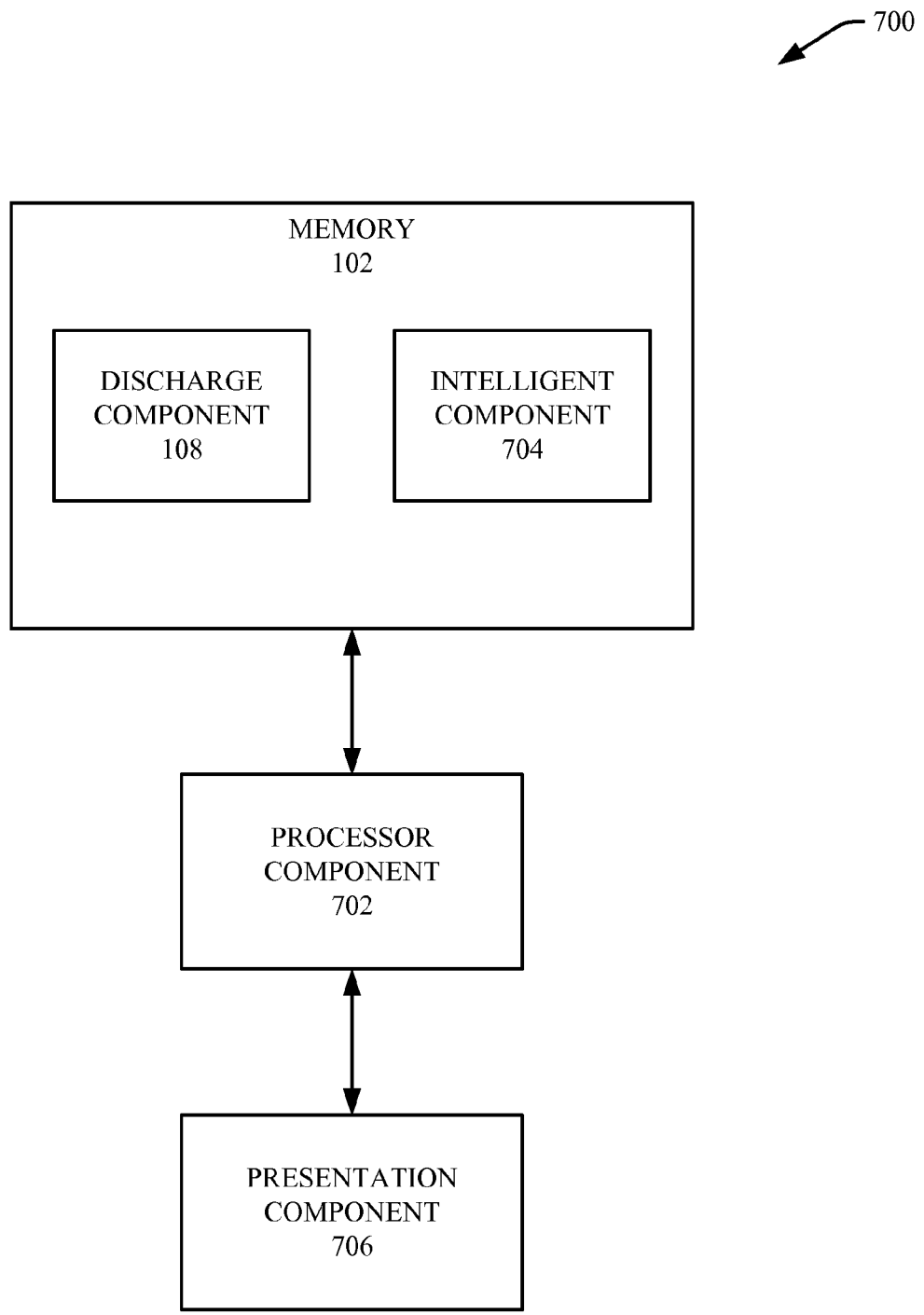
FIG. 7 illustrates a block diagram of a system that employs intelligence to facilitate controlling the discharge component in accordance with an embodiment of the disclosed subject matter.

Turning to FIG. 7, depicted is a system 700 that can employ intelligence to erase memory cells in accordance with an aspect of the disclosed subject matter. System 700 can include a memory 102 that can facilitate storage of data. Memory 102 can contain a discharge component 108 that can facilitate the performance of operations (e.g., channel erase) associated with core cells in the memory 102. The memory 102 and discharge component 108 each can be the same or similar, and/or can contain the same or similar functionality, as respective components described herein, for example, with regard to system 100, system 200, system 300, system 400, system 500, and/or system 600. It is to be appreciated and understood that, for reasons of clarity, certain components (e.g., memory array 104, y-decoder component 106, etc.) are not illustrated in FIG. 7, although such certain components can be included in system 700.

The memory 102 can be associated with a processor component 702 that can be a typical applications processor that can manage communications and run applications. For example, the processor component 702 can be a processor that can be utilized by a computer, mobile handset, personal data assistant (PDA), or other electronic device. The processor component 702 can generate commands, including read, write, and/or erase commands, in order to facilitate reading data from, writing data to, and/or erasing data from the memory component 102. In one aspect, the processor component 702 can facilitate controlling the discharge component 108 and associated discharge controller component (e.g., 206) via control signals and/or programs written in at least one programming language (e.g. C, C++, Java, and/or microcode, for example).

The system 700 can further include an intelligent component 704 that can be associated with a discharge component (e.g., 108) and/or other components in memory 102, and can analyze data, and based in part on such data, can make an inference(s) and/or a determination(s) regarding a voltage to be selected (e.g., via voltage generate ($V_{REF}$) 302) to facilitate the control of the discharge voltage supplied to the discharge transistor components (e.g., LOW T0, LOW T1, LOW T2, LOW T3, through LOW TN, as described herein, for example, with regard to system 200). For example, the intelligent component 704 can evaluate current and/or historical information concerning data errors or lack of data errors associated with various BL discharge rates, and based in part on such information and/or predefined criteria, can make an inference as to what $V_{CC}$ voltage (e.g., via $V_{CC}$ voltage generator 208) can be generated to facilitate a desired voltage be applied to the gate(s) of the protection transistor components (e.g., HIGH T0, HIGH T1, HIGH T2, HIGH T3, through HIGH TN, as described herein, for example, with regard to system 200).

As another example, during a program operation, the intelligent component 704 can analyze current and/or historical information concerning data errors or lack of data errors associated with various BL discharge rates, and based in part on such information and/or predefined criteria, can make an inference as to what discharge voltage (e.g., via the voltage generator ($V_{REF}$) 302) can be generated to facilitate a desired voltage be applied to the gate(s) discharge transistor components (e.g., LOW T0, LOW T1, LOW T2, LOW T3, through LOW TN).

It is to be understood that the intelligent component 704 can provide for reasoning about or infer states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data (e.g., historical data), whether or not the events are correlated in close temporal proximity, and whether the events and data come from one or several event and data sources. Various classification (explicitly and/or implicitly trained) schemes and/or systems (e.g., support vector machines, neural networks, expert systems, Bayesian belief networks, fuzzy logic, data fusion engines . . . ) can be employed in connection with performing automatic and/or inferred action in connection with the disclosed subject matter.

A classifier is a function that maps an input attribute vector, x=(x1, x2, x3, x4, xn), to a confidence that the input belongs to a class, that is, f(x)=confidence(class). Such classification can employ a probabilistic and/or statistical-based analysis (e.g., factoring into the analysis utilities and costs) to prognose or infer an action that a user desires to be automatically performed. A support vector machine (SVM) is an example of a classifier that can be employed. The SVM operates by finding a hypersurface in the space of possible inputs, which hypersurface attempts to split the triggering criteria from the non-triggering events. Intuitively, this makes the classification correct for testing data that is near, but not identical to training data. Other directed and undirected model classification approaches include, e.g., naïve Bayes, Bayesian networks, decision trees, neural networks, fuzzy logic models, and probabilistic classification models providing different patterns of independence can be employed. Classification as used herein also is inclusive of statistical regression that is utilized to develop models of priority.

System 700 also can include a presentation component 706 that can present data associated with the processor component 702 and/or the discharge component 108. It is to be appreciated that the presentation component 706 can be incorporated into the processor component 702 and/or a stand-alone unit. The presentation component 706 can provide various types of user interfaces to facilitate interaction between a user and any component coupled to the processor component 702.

The presentation component 706 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the processor component 702.

The user can also interact with the regions to select and provide information via various devices such as a mouse, a roller ball, a keypad, a keyboard, a pen and/or voice activation, for example. Typically, a mechanism such as a push button or the enter key on the keyboard can be employed subsequent entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

Figure 8:
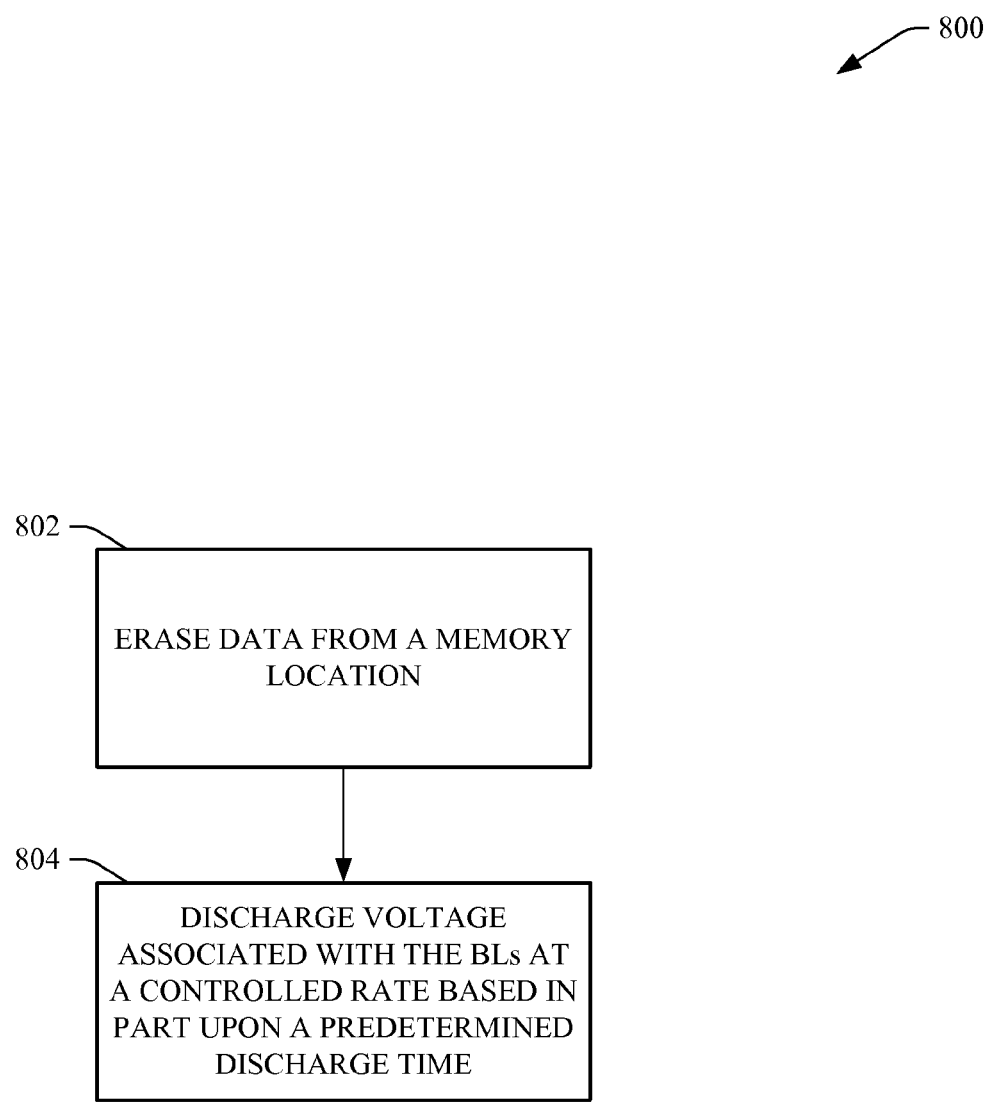
FIG. 8 illustrates a methodology that facilitates erasing data from a memory array in accordance with an aspect of the disclosed subject matter.
Figure 9:
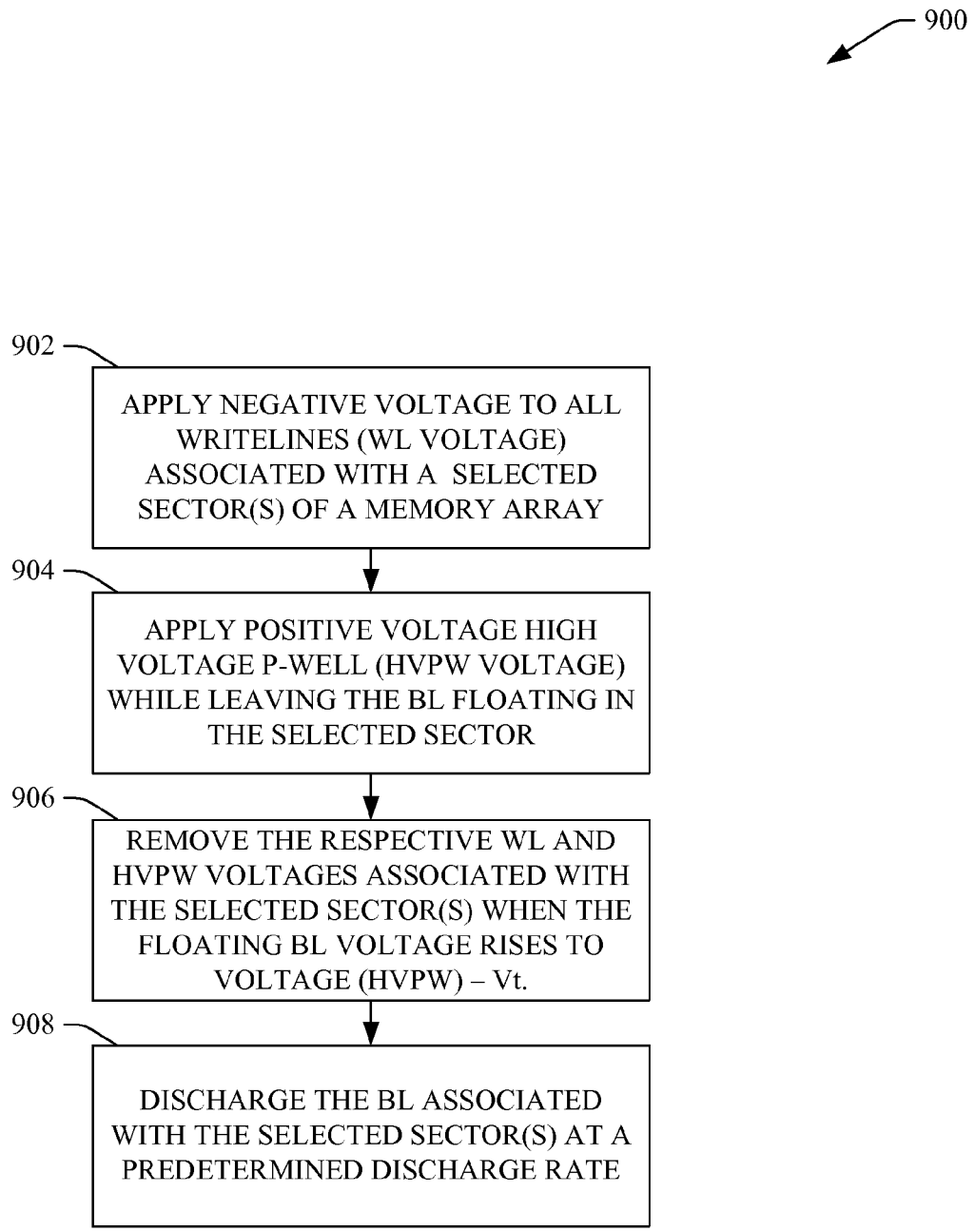
FIG. 9 illustrates a methodology that facilitates discharging BL during an erase operation in accordance with an aspect of the disclosed subject matter.
Figure 10:
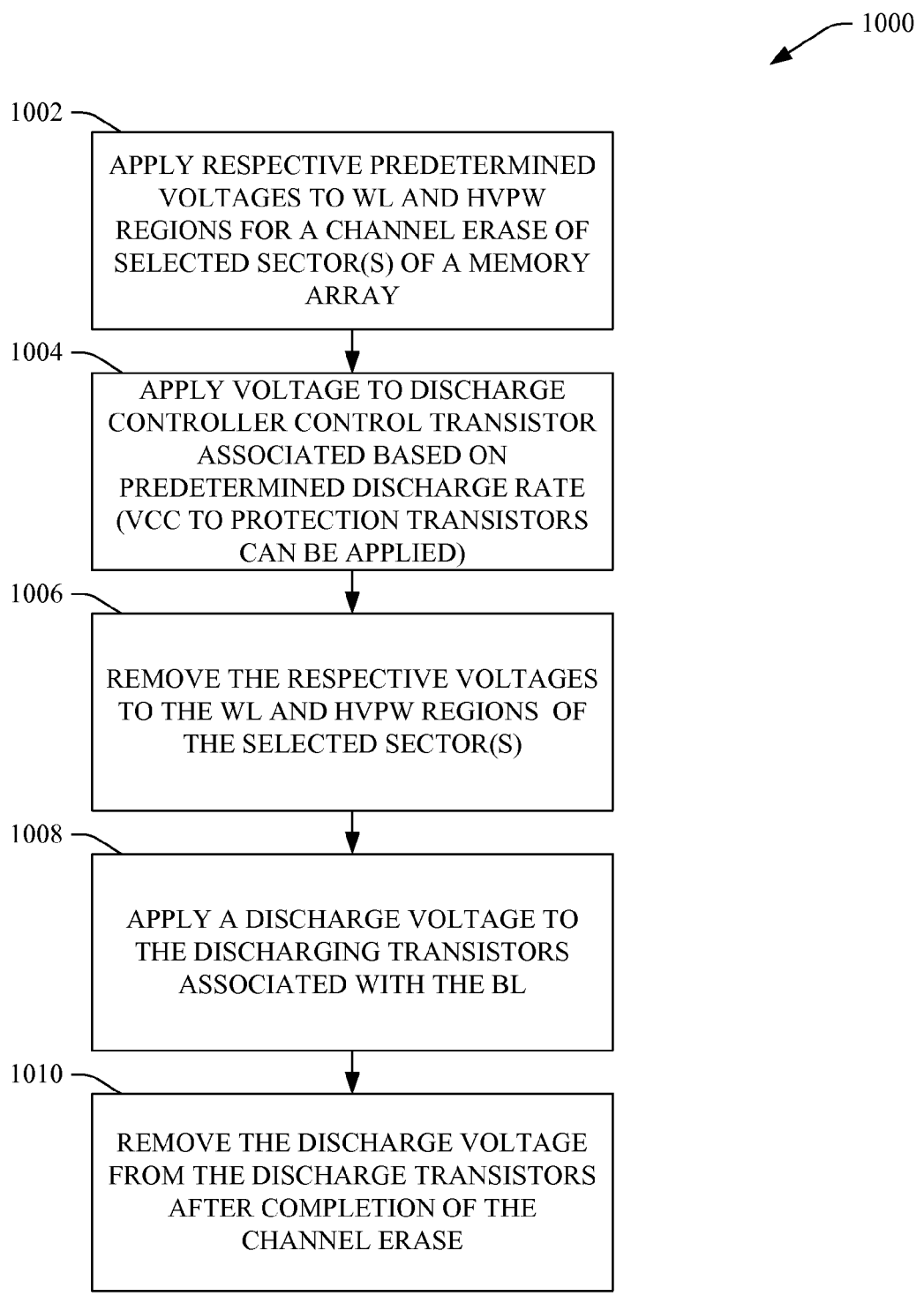
FIG. 10 depicts a methodology that facilitates controlling the discharge component in accordance with an aspect of the disclosed subject matter.

FIGS. 8-10 illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring to FIG. 8, a methodology 800 that can facilitate erasing data from a memory array in accordance with an aspect of the disclosed subject matter. At 802, an erase command can be issued to erase data from a selected sector of memory. In accordance with one aspect of the disclosed subject matter, the erase command can be generated by a processor (e.g., 702) and/or a memory microcontroller (e.g., 412), for example. In accordance with an aspect of the disclosed subject matter, the erase command can be, for example, associated with channel erase of memory cells within a selected sector(s).

At 804, the voltage associated with a BL(s) (e.g., BL1, BL2, BL3 through BLN of system 600 and/or system 700) can be discharged at a controlled rate based, in part, upon a desired predetermined discharge time. Controlling the discharge rate so that the discharge of BLs is performed within a desired predetermined period of time can facilitate reducing and/or eliminating undesirable functionality issues, such as hot switching, which can occur during channel erases of core cells in a memory (e.g., 102, 402). For example, a discharge controller component (e.g., 206) can facilitate changing the voltage applied to the gate(s) of the discharge transistor components (e.g., LOW T0, LOW T1, LOW T2, LOW T3, through LOW TN of system 200) from 0V to a value that facilitates discharging the BL within a 100 nanoseconds (ns), for example. At this point, methodology 800 can end.

Conventionally, nonvolatile memory erases utilized a method known as hot-hole (HH) injection to facilitate erasing selected sectors of a memory array. During a HH injection, a negative voltage can be applied to the gate(s) of the selected memory cell(s) (e.g., word-lines (WLs)) associated with a memory array(s) (e.g., 104). The amplitude of the negative voltage applied to the gate(s) of the memory cells can be, for example, a set value supplied by a voltage generator based on the size of the corresponding WL transistors, for example. Further, a positive voltage can be applied to the source(s)/drain(s) (e.g., bit lines (BL)) of the selected memory cell(s) (e.g., bit lines BL0, BL1, BL2, BL3 through BLN of system 500) associated with the memory array(s) during a HH injection erase. In accordance with one aspect, a negative voltage of −6V can be applied to the gate(s) (e.g., WL(s)) of the memory cells associated with the memory array(s) while a positive voltage of +6V or +7V can be applied to the source (s)/drain(s) (e.g. BL) of the memory cells. The −6V applied to the WLs and the +6V or +7V applied to the BLs of the memory cells can then cause the memory cell to be erased by injecting holes into the floating gates of the selected memory cells. The voltages associated with HH injection (e.g. typically less than 7 volts) allows for a y-decoding component (e.g., 106) to facilitate connecting the selected BLs to ground (e.g., 0V). Because the voltage of the associated BLs are relatively low, the y-decoder component can effectively facilitate discharging the BLs associated with HH injection erase operation. However, during a channel erase, which can provide a more efficient means of erasing memory cells, higher voltages associated with the BLs are used, thus requiring an alternative discharge scheme to allow the use of existing y-decoder components within memory devices (e.g., 402, 102). Methodology 900 and methodology 1000 illustrates, in part, this discharge scheme.

Referring to FIG. 9, a methodology 900 that can facilitate a channel erase wherein the bit lines are discharged at a desired rate in accordance with the disclosed subject matter is illustrated. At 902, an erase operation can be initiated by applying a negative voltage to the selected sector write-lines (WL) (e.g. WL0, WL1, WL2, through WLM) of a memory array (e.g., 104). In accordance with one aspect of the disclosed subject matter, a processor component (e.g., 702) and/or a memory microcontroller (e.g., 412), for example, can facilitate initiating the erase operation on a selected sector of memory array(s) (e.g., 104) by applying a voltage of approximately −11 volts, for example, to the WL of the selected sector.

At 904, a predetermined positive voltage can be applied to the selected sector high voltage p-well (HVPW) regions (e.g., HVPW 604). In accordance with one aspect of the disclosed subject matter, a processor component (e.g., 702) and/or memory controller component (e.g., 412) can facilitate controlling a voltage generator, for example, to apply approximately 11 volts the HVPW regions of the sectors selected to be erased.

At 906, the respective voltages applied to the WL and HVPW region of the selected sectors can be removed when the floating BL voltage level rises to a level equivalent to, or substantially equivalent to, the HVPW voltage level minus $V_t$. The respective voltages applied to the WL and HVPW regions can cause a voltage to be induced on the BLs (e.g., BL1, BL2, BL2 through BLN) associated with the WL and HVPW region that received the respective voltages, where the respective voltage levels at the BLs can float and vary based in part on WL voltage and/or HVPW voltage. In one aspect, when the BL voltage is equal to, or substantially equal to, the HVPW voltage minus one $V_t$, the memory controller component can facilitate removing the respected voltages applied to the WL and HVPW regions of the selected sectors in the memory.

For example, the BL associated with the channel erase can obtain a charge of approximately 10.3 volts when the associated HVPW is set to a voltage of 11 volts during a channel erase. In accordance with one aspect of the disclosed subject matter, a processor component or memory controller component, for example, can facilitate removing the WL and HVPW when a voltage is induced onto the BLs associated with a channel erase. In accordance with one aspect of the disclosed subject matter, a voltage generator(s) can remove, for example, the respective voltages associated with the WL and HVPW region.

At 908, the BL associated with the memory to be erased can be discharged. In accordance with one aspect of the disclosed subject matter, a discharge component (e.g., 108) can control the rate at which the BL is discharged of voltage that accumulated on the BL during the channel erase, for example.

In accordance with one aspect of the disclosed subject matter, a discharge controller component (e.g., 206) can facilitate supplying the discharge transistor components (e.g., LOW T0, LOW T1, LOW T2, LOW T3, through LOW TN of system 200) with a voltage based on the predetermined discharge rate. In accordance with one aspect of the disclosed subject matter, a processor and/or memory microcontroller can facilitate controlling the voltage at which a discharge controller component (e.g., 206) can supply to the discharge transistor components by adjusting the voltage supplied to the control transistor component (e.g., 304). It is preferred to have the an accurate and consistent voltage supplied (e.g., a reference or control voltage) to the gate of the control transistor component, thus in accordance with one aspect of the disclosed subject matter, the reference voltage can be generated using bandgap reference, for example, to ensure its accuracy and consistency. If a band-gap reference voltage is used, for example, to supply the reference voltage to the control transistor component, the associated discharge voltage supplied to the gate(s) of the discharge transistor components can be approximately the predetermined reference voltage minus the $V_t$ voltage. For example, if a reference voltage of approximately 2.0 volts is used, a corresponding discharge voltage of approximately 1.1 volts can be applied to the gates of the discharge transistor components. Further, by providing a reference voltage of approximately 2.0 volts to the gate of the control transistor component the discharge rate associated with discharging a BL at approximately 10V, for example, can take approximate 180 nanoseconds (ns).

In accordance with one aspect of the disclosed subject matter, the discharge voltage supplied to the gate(s) of the discharge transistor components can be determined based on, for example, the size of the associated discharge transistor components, the amount of voltage to be discharged from the BL, the protection voltage supplied (e.g., via 208) to the protection transistor components (e.g. HIGH T0, HIGH T1, HIGH T2, HIGH T3, through HIGH TN of system 200), the size of the protection transistor components, or any combination thereof.

FIG. 1000 depicts a methodology 1000 that can facilitate controlling the discharge rate of BL in accordance with the disclosed subject matter. At 1002, a memory erase operation can be initiated by applying respective predetermined voltages to a WL and HVWP region of a selected sector(s) of a memory array(s). For example, a voltage generator can supply a negative voltage to the gate(s) of the memory cells (e.g., W0, W2, W3 through WN (WL) of systems 500 and/or system 600), and a voltage generator, that can be the same or similar to the voltage generator that supplies the voltage to the WL, can supply a positive voltage to the HVPN (e.g., 604) regions of the selected sector(s).

At 1004, a voltage can be applied to the control transistor component (e.g., 304) to facilitate supplying a discharge voltage to the discharge transistor components (e.g., LOW T0, LOW T1, LOW T2, LOW T3 through LOW TN of system 200, for example) associated with the channel erase. The discharge voltage, in turn, can facilitate discharging the BL associated with the channel erase at a predetermined discharge rate once the discharge controller component (e.g., 206) is enabled.

At 1006, the respective voltages applied to the WL and HVPW region can be removed. In accordance with one aspect of the disclosed subject matter, an x-decoder component (e.g., 410) can facilitate removing the voltage applied to the WL and a voltage generator, for example, can facilitate removing the voltage applied to the HVPW regions associated with the channel erase.

At 1008, a discharge voltage can be applied to the discharge transistor components associated with the BL for a channel erase. In accordance with one aspect of the disclosed subject matter, a processor, a memory microcontroller, or other controlling device, for example, can facilitate enabling the discharge controller component (e.g., 206) that can supply the discharge voltage to the discharge transistor components. At this point, the respective voltages associated the WL and HVPW regions be removed, and the BL associated with have an induced charge. In accordance with one aspect of the disclosed subject matter, an enable signal (e.g. enable signal (PGMR)) can be asserted to facilitate enabling the discharge controller component (e.g., via 306) to supply the gates of the discharge transistor components with the discharge voltage.

In accordance with one aspect of the disclosed subject matter, the voltage applied to the HVPW region will have induced a corresponding voltage to the BL associated with the channel erase. For example, a voltage of approximately 10 volts applied to HVPW region can induce a voltage of approximately 9.3 volts to the BL (e.g., the HVPW voltage minus a $V_t$ voltage).

At 1010, the discharge voltage can be removed from the discharge transistor components. For example, a processor, a memory microcontroller, or other controlling device can facilitate removing the discharge voltage from the discharge transistor components. In accordance with one aspect of the disclosed subject matter, the enable signal (PGMR) can be de-asserted whereby facilitating the removal of the discharging voltage from the discharging transistor components. At this point, methodology 1000 can end.

As utilized herein, terms "component," "system," "interface," and the like, are intended to refer to a computer-related entity, either hardware, software (e.g., in execution), and/or firmware. For example, a component can be a process running on a processor, a processor, an object, an executable, a program, and/or a computer. By way of illustration, both an application running on a server and the server can be a component. One or more components can reside within a process and a component can be localized on one computer and/or distributed between two or more computers.

Furthermore, the disclosed subject matter may be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the disclosed subject matter.

Some portions of the detailed description have been presented in terms of algorithms and/or symbolic representations of operations on data bits within a computer memory. These algorithmic descriptions and/or representations are the means employed by those cognizant in the art to most effectively convey the substance of their work to others equally skilled. An algorithm is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the foregoing discussion, it is appreciated that throughout the disclosed subject matter, discussions utilizing terms such as processing, computing, calculating, determining, and/or displaying, and the like, refer to the action and processes of computer systems, and/or similar consumer and/or industrial electronic devices and/or machines, that manipulate and/or transform data represented as physical (electrical and/or electronic) quantities within the computer's and/or machine's registers and memories into other data similarly represented as physical quantities within the machine and/or computer system memories or registers or other such information storage, transmission and/or display devices.

Figure 11:
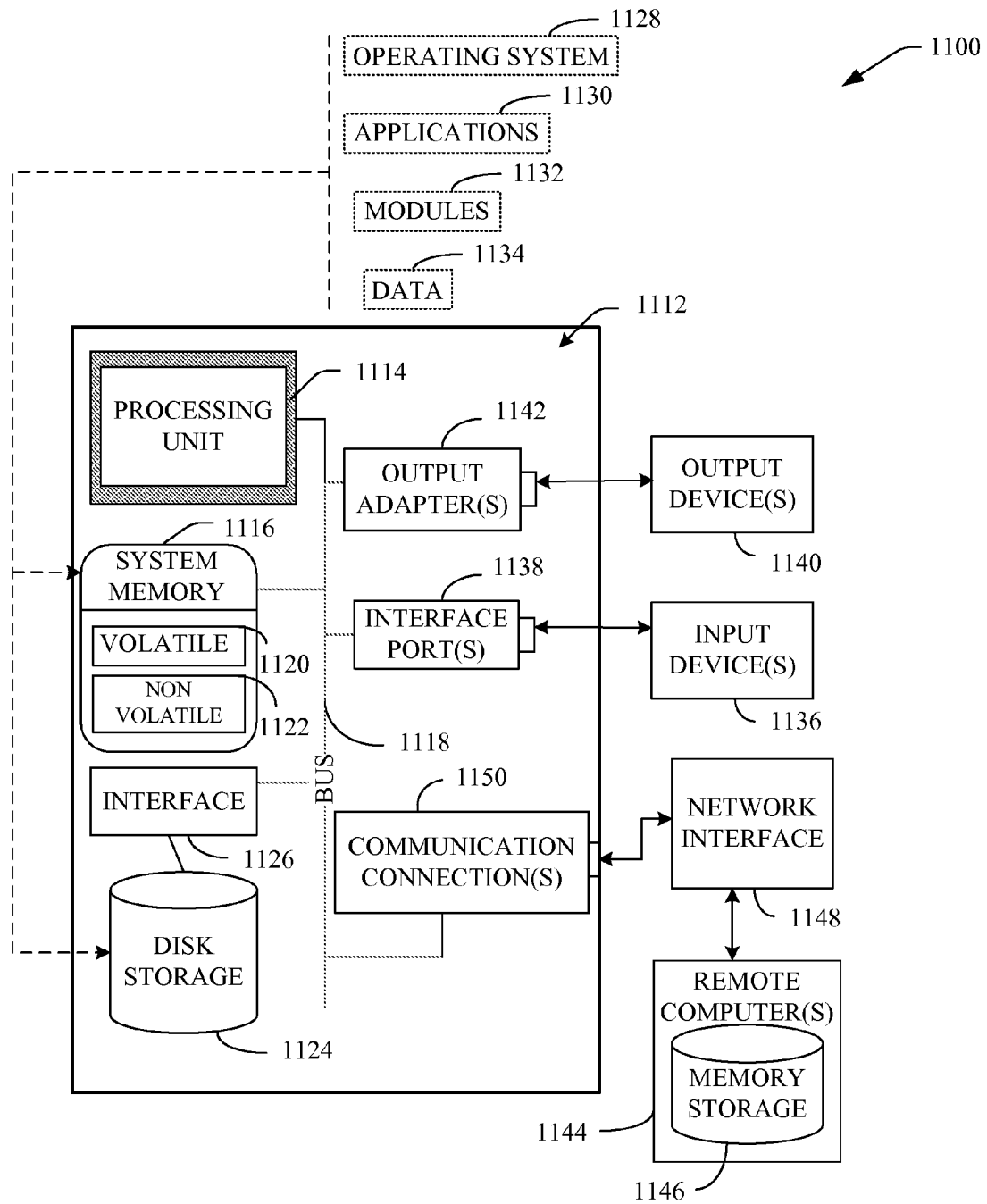
FIG. 11 is a schematic block diagram illustrating a suitable operating environment.
Figure 12:
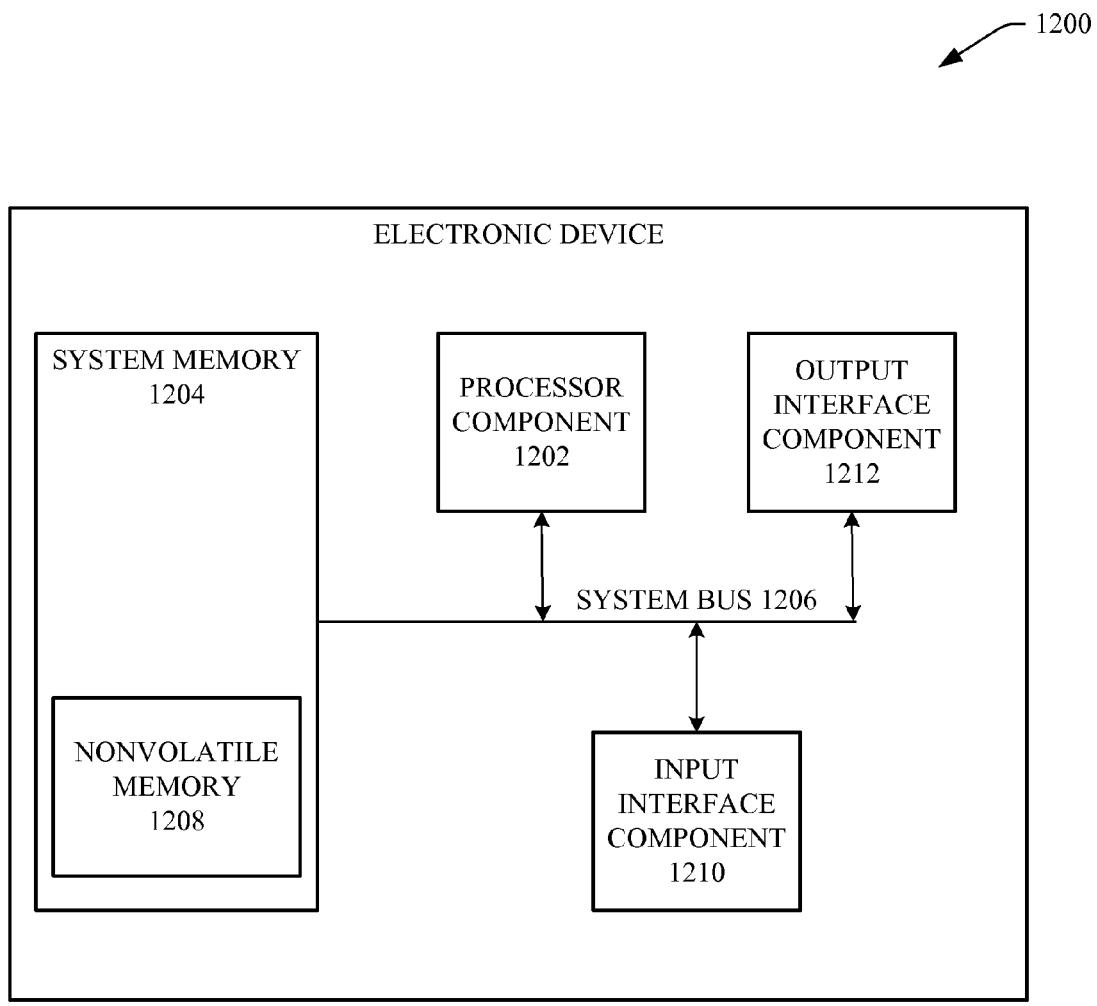
FIG. 12 is a block diagram of an exemplary electronic device that can utilize the memory device(s).

In order to provide a context for the various aspects of the disclosed subject matter, FIGS. 11 and 12 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on stand-alone computers. In a distributed computing environment, program modules may be located in both local and remote memory storage devices.

With reference to FIG. 11, a suitable environment 1100 for implementing various aspects of the claimed subject matter includes a computer 1112. The computer 1112 includes a processing unit 1114, a system memory 1116, and a system bus 1118. The system bus 1118 couples system components including, but not limited to, the system memory 1116 to the processing unit 1114. The processing unit 1114 can be any of various available processors. Dual microprocessors and other multiprocessor architectures also can be employed as the processing unit 1114.

The system bus 1118 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1116 can include volatile memory 1120 and nonvolatile memory 1122. The basic input/output system (BIOS), containing the basic routines to transfer information between elements within the computer 1112, such as during start-up, can be stored in nonvolatile memory 1122. By way of illustration, and not limitation, nonvolatile memory 1122 can include ROM, PROM, EPROM, EEPROM, or flash memory. Volatile memory 1120 can include RAM, which can act as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1112 also includes removable/non-removable, volatile/nonvolatile computer storage media. FIG. 11 illustrates, for example, a disk storage 1124. Disk storage 1124 includes, but is not limited to, devices like a magnetic disk drive, floppy disk drive, tape drive, Jaz drive, Zip drive, LS-100 drive, flash memory card, or memory stick. In addition, disk storage 1124 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1124 to the system bus 1118, a removable or non-removable interface is typically used, such as interface 1126.

It is to be appreciated that FIG. 11 describes software that acts as an intermediary between users and the basic computer resources described in the suitable operating environment 1100. Such software includes an operating system 1128. Operating system 1128, which can be stored on disk storage 1124, acts to control and allocate resources of the computer system 1112. System applications 1130 take advantage of the management of resources by operating system 1128 through program modules 1132 and program data 1134 stored either in system memory 1116 or on disk storage 1124. It is to be appreciated that the disclosed subject matter can be implemented with various operating systems or combinations of operating systems.

A user enters commands or information into the computer 1112 through input device(s) 1136. Input devices 1136 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1114 through the system bus 1118 via interface port(s) 1138. Interface port(s) 1138 include, for example, a serial port, a parallel port, a game port, and a universal serial bus (USB). Output device(s) 1140 use some of the same type of ports as input device(s) 1136. Thus, for example, a USB port may be used to provide input to computer 1112, and to output information from computer 1112 to an output device 1140. Output adapter 1142 is provided to illustrate that there are some output devices 1140 like monitors, speakers, and printers, among other output devices 1140, which require special adapters. The output adapters 1142 include, by way of illustration and not limitation, video and sound cards that provide a means of connection between the output device 1140 and the system bus 1118. It should be noted that other devices and/or systems of devices provide both input and output capabilities such as remote computer(s) 1144.

Computer 1112 can operate in a networked environment using logical connections to one or more remote computers, such as remote computer(s) 1144. The remote computer(s) 1144 can be a personal computer, a server, a router, a network PC, a workstation, a microprocessor based appliance, a peer device or other common network node and the like, and typically includes many or all of the elements described relative to computer 1112. For purposes of brevity, only a memory storage device 1146 is illustrated with remote computer(s) 1144. Remote computer(s) 1144 is logically connected to computer 1112 through a network interface 1148 and then physically connected via communication connection 1150. Network interface 1148 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereof, packet switching networks, and Digital Subscriber Lines (DSL).

Communication connection(s) 1150 refers to the hardware/software employed to connect the network interface 1148 to the bus 1118. While communication connection 1150 is shown for illustrative clarity inside computer 1112, it can also be external to computer 1112. The hardware/software necessary for connection to the network interface 1148 includes, for exemplary purposes only, internal and external technologies such as, modems including regular telephone grade modems, cable modems and DSL modems, ISDN adapters, and Ethernet cards.

Referring to FIG. 12, illustrated is a block diagram of an example non-limiting electronic device 1200 that can incorporate system 100 and system 400, or a portion(s) thereof. The electronic device can include, but is not limited to, network equipment (e.g. routers, access points), a media player and/or recorder (e.g., audio player and/or recorder, video player and/or recorder), a television, a smart card, a phone, a cellular phone, a smart phone, an electronic organizer, a PDA, a portable email reader, a laptop computer, a digital camera, an electronic device associated with digital rights management, a Personal Computer Memory Card International Association (PCMCIA) card, a trusted platform module (TPM), a Hardware Security Module (HSM), a set-top box, a digital video recorder, a gaming console, a navigation device (e.g., global position satellite (GPS) system/device), a secure memory device with computational capabilities, a devices with a tamper-resistant chip(s), an embedded computer in a machine (e.g., an airplane, a copier, a motor vehicle, a microwave oven), and the like.

Components of the electronic device 1200 can include, but are not limited to, a processor component 1202, a system memory 1204, and a system bus 1206 that can couple various system components including the system memory 1204 to the processing unit 1202. The system bus 1206 can be any of several types of bus structures including a memory bus or memory controller, a peripheral bus, or a local bus using any of a variety of bus architectures.

Electronic device 1200 can typically include a variety of computer readable media. Computer readable media can be any available media that can be accessed by the electronic device 1200. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 1208 or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1200. Communication media typically embodies computer readable instructions, data structures, program modules or other data in a modulated data signal such as a carrier wave or other transport mechanism and includes any information delivery media.

The system memory 1204 can include computer storage media in the form of volatile and/or nonvolatile memory such as nonvolatile memory 1208. In accordance with one aspect, the nonvolatile memory can be and/or can comprise, and/or can contain the same or similar functionality as, the memory component 102 (or memory 402), as described herein, for example, with regard to system 100. A basic input/output system (BIOS), containing the basic routines that help to transfer information between elements within electronic device 1200, such as during start-up, can be stored in system memory 1204. System memory 1204 typically also can contain data and/or program modules that can be immediately accessible to and/or presently being operated on by processing unit 1202. By way of example, and not limitation, system memory 1204 can also include an operating system, application programs, other program modules, and program data.

The nonvolatile memory 1208 can be removable or non-removable. For example, the nonvolatile memory 1208 can be in the form of a removable memory card or a USB flash drive. It will be appreciated that nonvolatile memory 1208 can be an exemplary embodiment of the system memory 1204 that can be utilized by the illustrated electronic device 1200 and that other types of electrically erasable memory (e.g. EEPROM) can be utilized instead of or in addition to the nonvolatile memory 1208.

A user can enter commands and information into the electronic device 1200 through input devices (not shown) such as a keypad, microphone, tablet or touch screen although other input devices can also be utilized. These and other input devices can be connected to the processing unit 1202 through input interface component 1210 that can be connected to the system bus 1206. Other interface and bus structures, such as a parallel port, game port or a universal serial bus (USB) can also be utilized. A graphics subsystem (not shown) can also be connected to the system bus 1206. A display device (not shown) can be also connected to the system bus 1206 via an interface, such as output interface component 1212, which can in turn communicate with video memory. In addition to a display, the electronic device 1200 can also include other peripheral output devices such as speakers (not shown), which can be connected through output interface component 1212.

What has been described above includes examples of aspects of the disclosed subject matter. It is, of course, not possible to describe every conceivable combination of components or methodologies for purposes of describing the disclosed subject matter, but one of ordinary skill in the art may recognize that many further combinations and permutations of the disclosed subject matter are possible. Accordingly, the disclosed subject matter is intended to embrace all such alterations, modifications and variations that fall within the spirit and scope of the appended claims. Furthermore, to the extent that the terms "includes," "has," or "having," or variations thereof, are used in either the detailed description or the claims, such terms are intended to be inclusive in a manner similar to the term "comprising" as "comprising" is interpreted when employed as a transitional word in a claim.

What is claimed is:

1. A system that facilitates performance of operations associated with memory comprising:
   the memory contains a plurality of memory cells that facilitate data storage;
   a discharge component that discharges a voltage associated with at least one bit line associated with the memory at a controlled discharge rate during an erase operation based at least in part on predetermined criteria; and
   a control transistor component that is supplied a control voltage at a gate of the control transistor component to control an amount of discharge voltage associated with the discharge component, wherein the controlled discharge rate is based at least in part on the amount of the discharge voltage, and wherein the control voltage is based at least in part on a predetermined band-gap reference voltage.

2. The system of claim 1, at least one memory cell of the plurality of the memory cells are multi-level cells, wherein at least one memory cell of the plurality of memory cells stores one or more bits of data.

3. The system of claim 1, the predetermined criteria is based at least in part on size of the discharge transistor components, size of the protection transistor components, a voltage associated the at least one bit line, or a voltage supplied to a gate of the protection transistor components.

4. The system of claim 1, the discharge component is comprised of a discharge transistor component and a protection transistor component connected in series, wherein a first side of the discharge transistor component and a first side of the protection transistor component each act respectively as drains and a second side of the discharge transistor component and a second side of the protection transistor component each respectively act as sources, wherein the first side of the discharge transistor component is connected to a ground and the second side of the discharge transistor component is connected the first side of the protection transistor component and the second side of the protection transistor component is connected to the at least one bit line associated with the memory.

5. The system of claim 4, the predetermined criteria is based at least in part on a voltage applied to the gate of the discharge transistor, a voltage applied to the gate of the protection transistor, or a predetermined amount of time to discharge the at least one bit line.

6. The system of claim 4, further comprising:
   a discharge controller component that controls the discharge voltage at an output of the discharge controller component.

7. The system of claim 6,
   wherein the control transistor component connects a source or a drain that connects to an enable component and another source or another drain of the control transistor component connects to the output of the discharge controller component, wherein the output of discharge controller component connects to the gate of the discharge transistor; further comprising:
   a voltage generator that supplies the control voltage to the gate of the control transistor component.

8. The system of claim 7, wherein the enable component facilitates control of supply of the discharge voltage to the discharge component.

9. The system of claim 7, wherein the control voltage supplied by the voltage generator is controlled to facilitate control of the controlled discharge rate such that, when the at least one bit line is being discharged, the voltage associated with the at least one bit line substantially corresponds to a voltage associated with a high voltage p-well (HVPW) associated with at least one memory cell, wherein the at least one memory cell is associated with the at least one bit line, to reduce risk of disturbance of the at least one memory cell.

10. The system of claim 7, further comprising:
    a processor that facilitates control of the voltage generator that supplies the control voltage to the gate of the control transistor component.

11. The system of claim 1, the discharge component is controlled by one or more computers or computer processes.

12. The system of claim 1, further comprising an intelligent component that infers at least one automated function to be performed by the discharge component.

13. The system of claim 1, the memory is at least one of flash memory, mask-programmed read-only memory (ROM), programmable ROM (PROM), Erasable PROM (EPROM), UltraViolet (UV)-erase EPROM, one-time programmable ROM, or electrically erasable PROM (EEPROM).

14. An electronic device comprising the system of claim 1.

15. The electronic device of claim 14, wherein the electronic device is one of a smart card, a computer, a laptop computer, network equipment, a media player, a media recorder, a television, a phone, a cellular phone, a smart phone, an electronic organizer, a personal digital assistant, a portable email reader, a digital camera, an electronic game, an electronic device associated with digital rights management, a Personal Computer Memory Card International Association (PCMCIA) card, a trusted platform module (TPM), a Hardware Security Module (HSM), a set-top box, a digital video recorder, a gaming console, a navigation system, a secure memory device with computational capabilities, a device with at least one tamper-resistant chip, an electronic device associated with an industrial control system, or an embedded computer in a machine, or a combination thereof, wherein the machine comprises one of an airplane, a copier, a motor vehicle, or a microwave oven.

16. A method that facilitates erasing data from a memory, comprising:
    erasing data from at least one memory cell in a memory array in the memory;
    discharging voltage of at least one bit line associated with the at least one memory cell based at least in part on a predetermined discharge rate to facilitate reduction of hot switching associated with the at least one memory cell;
    applying at least one control signal to facilitate enabling a discharge voltage to be applied to at least one discharge transistor component associated with the at least one bit line associated with the at least one memory cell;
    applying a control voltage to a gate of a control transistor to control the discharge voltage applied to the at least one discharge transistor component, wherein the predetermined discharge rate is based at least in part on the discharge voltage, and wherein the control voltage is based at least in part on a predetermined band-gap reference voltage.

17. The method of claim 16, further comprising:
controlling an amount of the control voltage to facilitate control of the predetermined discharge rate, wherein, during discharge, the voltage is being discharged from the at least one bit line such that the voltage associated with the at least one bit line substantially corresponds to a voltage associated with a high voltage p-well (HVPW) associated with the at least one memory cell to reduce risk of disturbance of the at least one memory cell.

18. The method of claim 16, further comprising:
connecting at least one discharge transistor component and at least one protection transistor component in series with each other to facilitate protection of the at least one discharge transistor component by the at least one protection transistor component during discharge of the voltage from the at least one bit line, wherein the at least one protection component facilitates electronically protecting the at least one discharge transistor component from voltages over a predefined maximum threshold voltage level that are associated with the at least one bit line during a channel erase.

19. The method of claim 16, wherein the discharge voltage corresponds to the control voltage minus a threshold voltage to facilitate controlling the discharge of voltage of the at least one bit line in accordance with the predetermined discharge rate.

20. The method of claim 16, wherein the predetermined discharge rate is based at least in part on a voltage applied to a gate of the at least one discharge transistor component, a voltage applied to a gate of at least one protection transistor component, or a predetermined amount of time to discharge the at least one bit line.

* * * * *